United States Patent
Torfs et al.

(10) Patent No.: US 10,039,193 B2
(45) Date of Patent: *Jul. 31, 2018

(54) ETCH-RESISTANT INKJET INKS FOR MANUFACTURING CONDUCTIVE PATTERNS

(71) Applicant: AGFA-GEVAERT, Mortsel (BE)

(72) Inventors: Rita Torfs, Mortsel (BE); Johan Loccufier, Mortsel (BE)

(73) Assignee: AGFA-GEVAERT, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 15/120,565

(22) PCT Filed: Jan. 28, 2015

(86) PCT No.: PCT/EP2015/051664
§ 371 (c)(1),
(2) Date: Aug. 22, 2016

(87) PCT Pub. No.: WO2015/132020
PCT Pub. Date: Sep. 11, 2015

(65) Prior Publication Data
US 2017/0013723 A1    Jan. 12, 2017

(30) Foreign Application Priority Data
Mar. 3, 2014   (EP) .................................... 14157441

(51) Int. Cl.
| | | |
|---|---|---|
| *H05K 3/06* | (2006.01) | |
| *C09D 11/328* | (2014.01) | |
| *C09D 11/101* | (2014.01) | |
| *G03F 7/027* | (2006.01) | |
| *G03F 7/105* | (2006.01) | |

(52) U.S. Cl.
CPC .......... *H05K 3/064* (2013.01); *C09D 11/101* (2013.01); *C09D 11/328* (2013.01); *G03F 7/027* (2013.01); *G03F 7/105* (2013.01); *H05K 2203/013* (2013.01); *H05K 2203/0545* (2013.01); *H05K 2203/0769* (2013.01)

(58) Field of Classification Search
None
See application file for complete search history.

(56) References Cited

U.S. PATENT DOCUMENTS

| | | | |
|---|---|---|---|
| 5,270,368 A | 12/1993 | Lent et al. | |
| 7,314,573 B2 * | 1/2008 | Hopper ................. | C09D 11/36 216/13 |
| 7,758,759 B2 * | 7/2010 | James .................... | C09D 11/34 216/100 |
| 2007/0242120 A1 * | 10/2007 | Tsuchimura ......... | C09D 11/101 347/100 |
| 2011/0024392 A1 * | 2/2011 | Sato ..................... | C09D 11/101 216/48 |
| 2017/0218520 A1 * | 8/2017 | De Mondt ............. | C23C 22/73 |
| 2017/0226355 A1 * | 8/2017 | Torfs .................... | C09D 11/101 |

FOREIGN PATENT DOCUMENTS

| | | |
|---|---|---|
| EP | 2 182 786 A1 | 5/2010 |
| WO | 2004/106437 A1 | 12/2004 |

OTHER PUBLICATIONS

Official Communication issued in International Patent Application No. PCT/EP2015/051664, dated Mar. 5, 2015.

* cited by examiner

*Primary Examiner* — Shamim Ahmed
(74) *Attorney, Agent, or Firm* — Keating and Bennett, LLP

(57) ABSTRACT

A method of manufacturing conductive patterns includes the steps of a) printing and curing UV curable inkjet to define a cured inkjet ink pattern on a metal sheet bonded to a non-conductive substrate; b) etching the metal sheet not covered by the cured ink pattern to expose the non-conductive substrate; and c) applying an alkaline solution to dissolve the cured inkjet ink pattern within 5 minutes.

12 Claims, No Drawings

ETCH-RESISTANT INKJET INKS FOR MANUFACTURING CONDUCTIVE PATTERNS

CROSS-REFERENCE TO RELATED APPLICATIONS

This application is a 371 National Stage Application of PCT/EP2015/051664, filed Jan. 28, 2015. This application claims the benefit of European Application No. 14157441.8, filed Mar. 3, 2014, which is incorporated by reference herein in its entirety.

BACKGROUND OF THE INVENTION

1. Field of the Invention

The present invention relates to an etch-resistant inkjet ink and a method of manufacturing conductive patterns.

2. Description of the Related Art

Printed circuit boards are usually made by coating a photo resist layer on a copper sheet bonded to a non-conductive substrate, applying a temporary UV mask of a negative image of a desired conductive pattern, UV exposing the photo resist layer, removing the non-exposed photo resist layer by a developer, removing unwanted copper by etching, removing the exposed photo resist layer by an alkaline stripping bath, thereby leaving only the desired conductive copper pattern present on the non-conductive substrate.

Etching is the process of using a chemical, usually a strong acid or mordant, to cut into the unprotected parts of a metal surface. The use of developer to remove the photo resist layer, often 50 μm thick or more, results in extra cost and chemical waste. Therefore, it has been investigated if the developing step could be eliminated by UV curable inkjet printing an etch-resistant inkjet ink layer on the copper sheet, which after etching is removed in flakes by the alkaline stripping bath to expose the conductive copper pattern.

U.S. Pat. No. 5,270,368 (VIDEOJET) discloses a UV curable, etch-resistant ink for inkjet printing circuit boards comprising a resin formulation having at least two acrylate components, one of which is an aromatic acrylate having a pendant carboxyl group and one of which is an acrylated epoxy monomer or dimer, a photoinitiator and an organic carrier. The preferred organic carrier of methanol and methyl ethyl ketone is employed in a range of 40% to 90% by weight of the ink composition. These volatile organic solvents lead to latency problems of inkjet print heads making reliable inkjet printing in an industrial environment process problematic. Reducing the amount of organic solvent leads to a too high ink viscosity, because some aromatic acrylate compounds traditionally used for preparing photo resist coatings have very high viscosity. For example, the bisphenol A ethoxylated diacrylate (Photomer™ 4028) used in all the examples of U.S. Pat. No. 5,270,368 (VIDEOJET) has a viscosity of 800 to 1200 mPa·s at 25° C. These aromatic acrylate compounds are essential for having a good balance in adhesion so that the printed ink layer is etch resistant yet easily removable after etching, especially since many different etching conditions and etchants are used in industry.

WO 2004/106437 A (AVECIA) discloses a process for etching a metal or alloy surface which comprises applying an etch-resistant ink by inkjet printing to selected areas of the metal or alloy, exposing the etch-resistant ink to actinic radiation and/or particle beam radiation to effect polymerisation, optionally thermally treating the etch-resistant ink and then removing the exposed metal or alloy by a chemical etching process wherein the etch-resistant ink is substantially solvent-free. All the disclosed etch-resistant inks include an acidic polymerizable compound. The inclusion of acidic polymerizable compounds has some undesirable side effects such as increased viscosity and decreased ink stability and curing speed.

Another problem is the flake formation in the alkaline stripping bath. Stripping solutions are normally alkaline metal hydroxides, such as sodium or potassium hydroxide, or based on amines such as mono or tri ethanolamine and tetra methyl ammonium hydroxide. The stripping solution breaks the polymer chain at the cross-linking point of the three dimensional structure, which is formed during the polymerization of the resist and before the bond between the resist and the copper surface is broken. In order to extend the working lifetime of the stripping solution, it is necessary to filter the solution to remove the stripped flake of resist. If the flake size is too large it tends to adhere to stripping equipment disturbing the smooth running of the manufacturing process. If the flakes are too small they pass through the filter and return in the stripping bath. After a while these small flakes accumulate and also start to disturb the smooth running of the manufacturing process. These very small flakes tend to block the nozzles of the sprays of the stripping line. The stripped flake size depends mainly on the type of stripping solution, the concentration of the stripping solution, the temperature of the stripping solution and the design of the stripping equipment, etc. This multitude of influencing factors makes it very difficult to control the flake size to a desired size.

Hence, there remains a need for improved low viscous radiation curable inkjet inks suitable for reliable inkjet printing in an industrial etching process applicable to a wide range of etchants and etching conditions and exhibiting no problems with stripping and flake formation.

SUMMARY OF THE INVENTION

In order to overcome the problems described above, preferred embodiments of the present invention provide a method of manufacturing conductive patterns as claimed in claim 1.

The above described flake size problem was eliminated by fully dissolving the etch-resistant inkjet ink layer in the stripping solution.

Further advantages and benefits of the invention will become apparent from the description hereinafter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Definitions

The term "monofunctional" means that the monomer or oligomer includes one free radical polymerizable group.

The term "difunctional" means that the monomer or oligomer includes two free radical polymerizable groups.

The term "polyfunctional" means that the monomer or oligomer includes more than two free radical polymerizable groups.

The term "alkyl" means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethyl-propyl and 2-methyl-butyl, etc.

Unless otherwise specified a substituted or unsubstituted alkyl group is preferably a $C_1$ to $C_6$-alkyl group.

Unless otherwise specified a substituted or unsubstituted alkenyl group is preferably a $C_1$ to $C_6$-alkenyl group.

Unless otherwise specified a substituted or unsubstituted alkynyl group is preferably a $C_1$ to $C_6$-alkynyl group.

Unless otherwise specified a substituted or unsubstituted aralkyl group is preferably a phenyl or naphthyl group including one, two, three or more $C_1$ to $C_6$-alkyl groups.

Unless otherwise specified a substituted or unsubstituted alkaryl group is preferably a $C_7$ to $C_{20}$-alkyl group including a phenyl group or naphthyl group.

Unless otherwise specified a substituted or unsubstituted aryl group is preferably a phenyl group or naphthyl group Unless otherwise specified a substituted or unsubstituted heteroaryl group is preferably a five- or six-membered ring substituted by one, two or three oxygen atoms, nitrogen atoms, sulphur atoms, selenium atoms or combinations thereof.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms Unless otherwise specified a substituted alkyl group, a substituted alkenyl group, a substituted alkynyl group, a substituted aralkyl group, a substituted alkaryl group, a substituted aryl and a substituted heteroaryl group are preferably substituted by one or more constituents selected from the group consisting of methyl, ethyl, n-propyl, isopropyl, n-butyl, isobutyl and tertiary-butyl, ester, amide, ether, thioether, ketone, aldehyde, sulfoxide, sulfone, sulfonate ester, sulphonamide, —Cl, —Br, —I, —OH, —SH, —CN and —NO$_2$.

Methods of Manufacturing Conductive Patterns

The method of manufacturing conductive patterns according to a preferred embodiment of the invention includes the steps of: a) UV curable inkjet printing a cured inkjet ink pattern on a metal sheet bonded to a non-conductive substrate; b) etching the metal sheet not covered by the cured ink pattern to expose the non-conductive substrate; and c) applying an alkaline solution to dissolve the cured inkjet ink pattern within 5 minutes.

In a preferred embodiment, the cured inkjet ink pattern has a thickness of less than 40 μm, preferably between 5 and 35 μm, more preferably between 10 μm and 30 μm. The thicker the cured inkjet ink pattern is, the more alkali is consumed in the stripping solution, leading to faster regeneration rates. If the cured ink pattern is thinner than 5 μm then the etch resistance becomes insufficient and so-called "undercut" occurs. This can reduce conductor widths and cause open-circuits.

In a particularly preferred embodiment of the manufacturing method, the UV curable inkjet ink used for inkjet printing the pattern contains a) one or more photoinitiators; b) a colorant decolorizing at a pH of more than 10; c) one or more hydrolyzable polyfunctional monomer or oligomer having at least one alkali hydrolyzable group located in the atomic chain between two polymerizable groups of the polyfunctional monomer or oligomer; and d) one or more water absorption controlling monomers being a monofunctional or difunctional monomer containing at least one functional group selected from the group consisting of a hydroxyl group, an ethylene oxide or oligo-ethylene oxide group, a tertiary amine group, an acidic group having a pK$_a$ not lower than 3 and a five to seven membered aromatic or non aromatic heterocyclic group. More preferred compositions of the UV curable inkjet ink are given here below.

Chemical etching is preferably done with ammonium persulfate or ferric chloride. Preferably the etchant is heated to a temperature of 30 to 50° C. for reducing the etching time.

The stripping solution or stripping bath is preferably an alkaline solution containing soda, potassium carbonate, alkaline metal hydroxides, such as sodium or potassium hydroxide, or based on amines such as mono or tri ethanolamine and tetra methyl ammonium hydroxide. A preferred stripping solution contains at least 5 wt % of sodium or potassium hydroxide. The stripping solution in use preferably has a temperature between 50° C. and 85° C., more preferably 60° C. to 80° C.

UV Curable Inkjet Inks

The UV curable inkjet is preferably a free radical polymerizable composition. In a preferred embodiment, the UV curable inkjet ink contains a) one or more photoinitiators; b) a colorant decolorizing at a pH of more than 10; c) one or more hydrolyzable polyfunctional monomer or oligomer having at least one alkali hydrolyzable group located in the atomic chain between two polymerizable groups of the polyfunctional monomer or oligomer; and d) one or more water absorption controlling monomers being a monofunctional or difunctional monomer containing at least one functional group selected from the group consisting of a hydroxyl group, an ethylene oxide or oligo-ethylene oxide group, a tertiary amine group, an acidic group having a pK$_a$ not lower than 3 and a five to seven membered aromatic or non aromatic heterocyclic group.

The hydrolyzable polyfunctional monomers or oligomers are responsible for the degradation of the cured inkjet ink pattern in the stripping solution resulting in the cured inkjet ink pattern being completely dissolved in the stripping solution. However, in order to obtain acceptable manufacturing times, a second monomer needs to be included. The water absorption controlling monomers are responsible for the swelling of the cured ink pattern in the stripping solution. This accelerates the dissolving of the cured ink pattern by the alkali present in the stripping solution.

Hydrolyzable Polyfunctional Monomers and Oligomers

The UV curable inkjet ink includes one or more hydrolyzable polyfunctional monomers or oligomers having at least one alkali hydrolyzable group located in the atomic chain between two polymerizable groups of the polyfunctional monomer or oligomer.

In a preferred embodiment, the at least one alkali hydrolyzable group located in the atomic chain between two polymerizable groups of the polyfunctional monomer or oligomer is selected from the group consisting of Formulas H-1 to H-4:

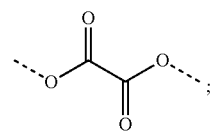

H-1

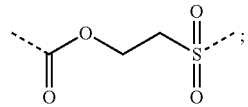

H-2

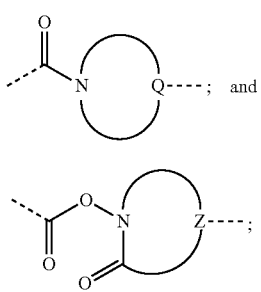

wherein
Q represents the necessary atoms to form a five membered aromatic ring group; Z represents the necessary atoms to form a five or six membered ring group; and the dashed lines represents the bonds to the rest of the polyfunctional monomer or oligomer.

In a further preferred embodiment, the at least one alkali hydrolyzable group H-3 is selected from the group consisting of an imidazole group, a benzimidazole group, a triazole group and a benzotriazole group.

In a further preferred embodiment, the at least one alkali hydrolyzable group H-4 is selected from the group consisting of an succinimid group and a phtalimid group.

In a particularly preferred embodiment, the at least one alkaline hydrolyzable group is an oxalate ester group.

The one or more hydrolyzable polyfunctional monomers or oligomers preferably contain polymerizable groups independently selected from the group consisting of an acrylate group, a methacrylate group, an acrylamide group, a methacrylamide group, a styrene group, a maleate group, a fumarate group, an itaconate group, a vinyl ether group, a vinyl ester group, an allyl ether group and an allyl ester group.

Typical examples of hydrolyzable polyfunctional monomers and oligomers having at least one alkali hydrolyzable group located in the atomic chain between two polymerizable groups of the polyfunctional monomers and oligomers are given in Table 1 without being limited thereto.

TABLE 1

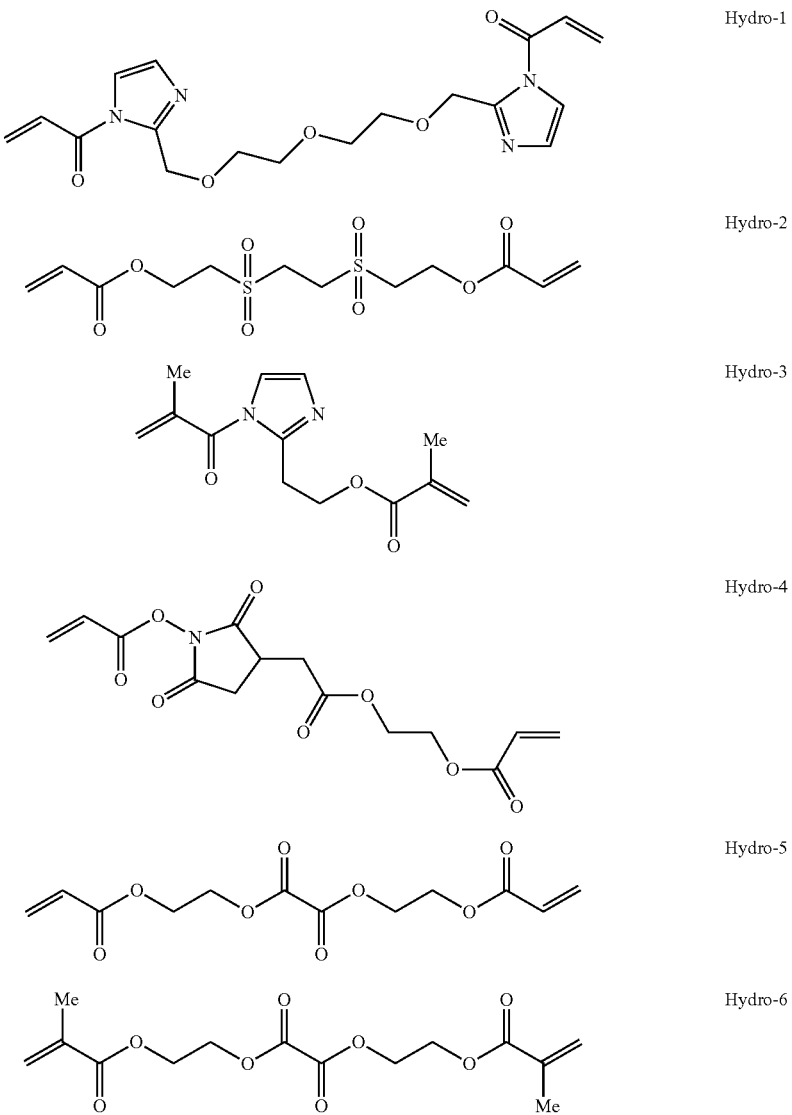

TABLE 1-continued

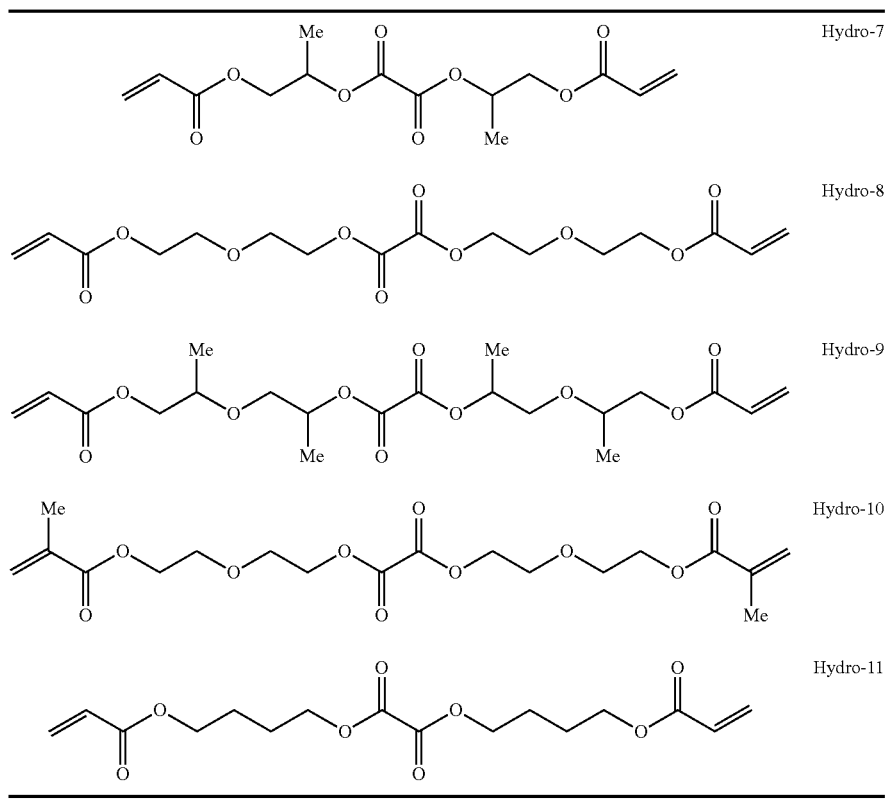

The one or more hydrolyzable polyfunctional monomers or oligomers having at least one alkali hydrolyzable group located in the atomic chain between two polymerizable groups of the polyfunctional monomer or oligomer is preferably present in the UV curable inkjet ink in an amount of at least 25 wt %, more preferably in an amount of at least 30 wt % based on the total weight of the UV curable inkjet ink.

Water Absorption Controlling Monomers

The UV curable inkjet ink contains one or more water absorption controlling monomers. A water absorption controlling monomer is a monofunctional or difunctional monomer containing at least one functional group selected from the group consisting of a hydroxyl group, an ethylene oxide or oligo-ethylene oxide group, a tertiary amine, an acidic function having a $pK_a$ not lower then 3 and a five to seven membered aromatic or non aromatic heteroring.

In a preferred embodiment, the one or more water absorption controlling monomers contain at least one functional group selected from the group consisting of a hydroxyl group an ethylene oxide or oligo-ethylene oxide group, a carboxylic acid group, a phenolic group, five to seven membered lactam group and a morpholino group.

In the most preferred embodiment, the one or more water absorption controlling monomers contain at least one functional group selected from the group consisting of an ethylene oxide or oligo-ethylene oxide group, a hydroxyl group and a morpholino group.

The water absorption controlling monomer is preferably a monofunctional monomer.

The one or more water absorption controlling monomers preferably include a polymerizable group selected from the group consisting of an acrylate group, a methacrylate group, a acrylamide group and a methacrylamide group, The one or more water absorption controlling monomers preferably include a polymerizable group selected from the group consisting of an acrylate group and an acrylamide group.

Suitable water absorption controlling monomers are given in Table 2, without being limited thereto.

TABLE 2

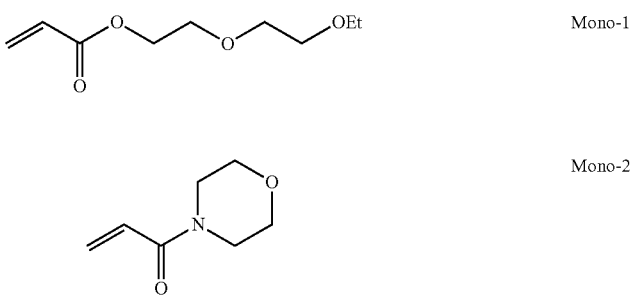

TABLE 2-continued
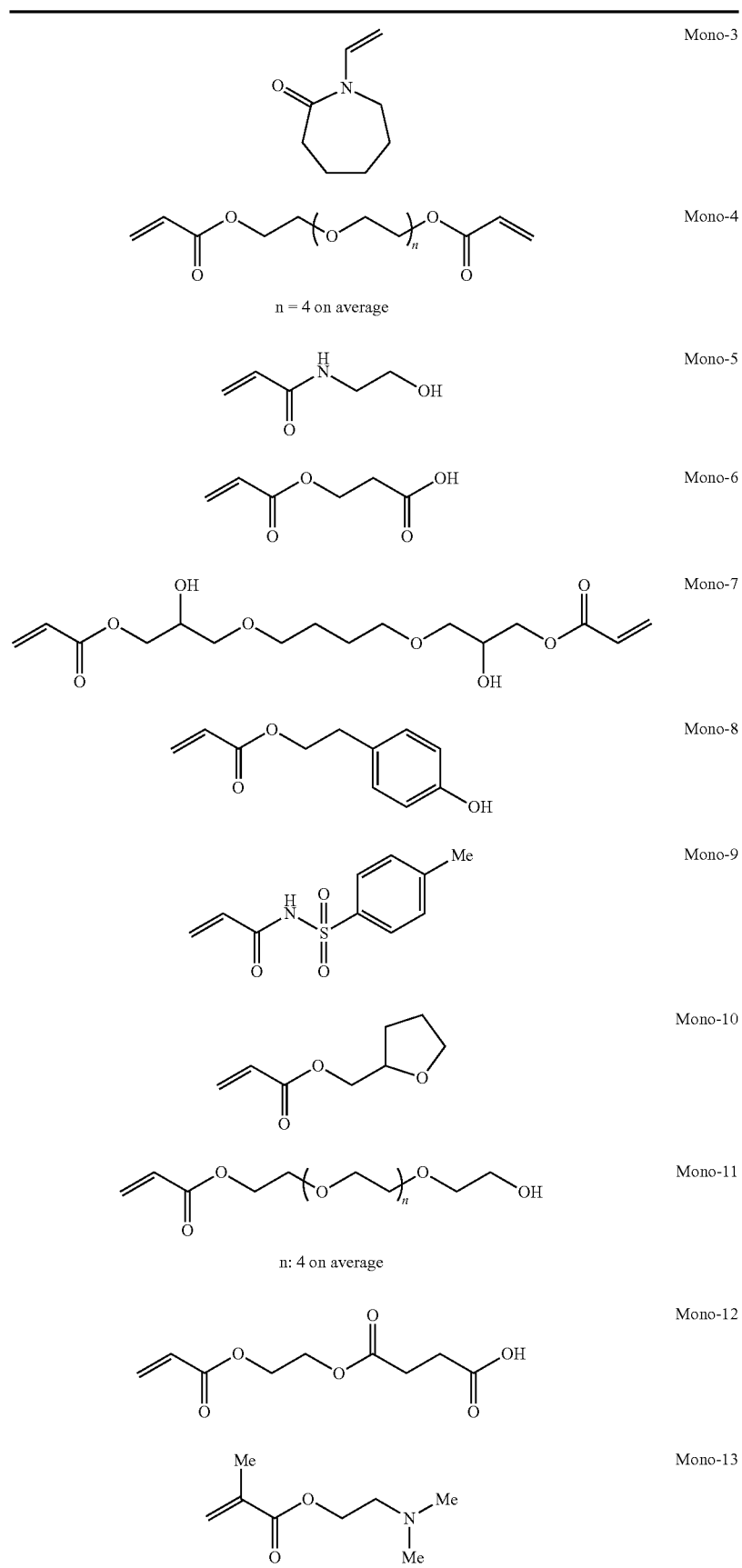

TABLE 2-continued

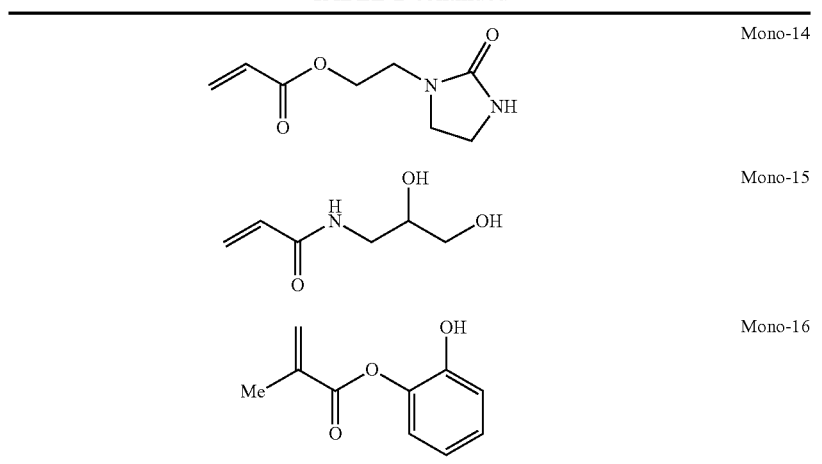

Mono-14

Mono-15

Mono-16

The one or more water absorption controlling monomers is preferably present in the UV curable inkjet ink in an amount of at least 20 wt % based on the total weight of the UV curable inkjet ink.

Other Monomers and Oligomers

The UV curable inkjet ink may contain one or more other monomers and oligomers next to the one or more hydrolyzable polyfunctional monomers and oligomers and the one or more water absorption controlling monomers, but preferably the UV curable inkjet ink consists of one or more hydrolyzable polyfunctional monomers and oligomers and one or more water absorption controlling monomers.

The monomers and oligomers may possess different degrees of functionality, and a mixture including combinations of mono-, di-, tri- and higher functionality monomers, oligomers and/or prepolymers may be used. The viscosity of the UV curable inkjet ink can be adjusted by varying the ratio between the monomers and oligomers.

Particularly preferred other monomers and oligomers are those listed in [0106] to [0115] in EP 1911814 A (AGFA).

The one or more other monomers and oligomers are preferably present in the UV curable inkjet ink in an amount of no more than 25 wt %, more preferably no more than 15 wt % and most preferably in an mount of 0 to 10 wt % based on the total weight of the UV curable inkjet ink.

Colorants

The UV curable inkjet ink preferably includes colorant. The colorant makes the temporary mask clearly visible to the manufacturer of conductive patters, allowing a visual inspection of quality.

The colorant in the cured inkjet ink pattern on the metal sheet and the UV curable inkjet ink may be a pigment or a dye. The colorant becomes substantially colourless upon dissolving of the cured inkjet ink pattern in the alkaline a stripping solution.

In a preferred embodiment, the colorant of the inkjet ink is a dye which decolorizes at a pH of more than 10.

In a preferred embodiment, the colorant is dissolved in the radiation curable inkjet ink, i.e. it is a dye. Compared to pigments, dyes allow much faster discolouration. They also do not cause problems of dispersion stability in the inkjet ink due to sedimentation.

In a first preferred embodiment the colorant is represented by the open form of a lactone based leuco dye. In a further preferred embodiment, the leuco dyes are leuco dyes according to Formula (I) to (VIII).

Formula (I)

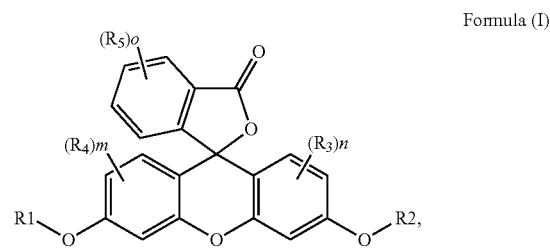

wherein $R^1$ and $R^2$ are independently selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group; n and m independently represent an integer from 0 to 3; $R^3$ and $R^4$ are independently selected from the group consisting of a substituted or unsubstituted alkyl group, an alkoxy group and a halogen; $R^5$ is selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group, a halogen, an alkoxy group, an ester, an amide, an amine and a carboxylic acid; and o represents an integer from 0 to 4.

Formula (II)

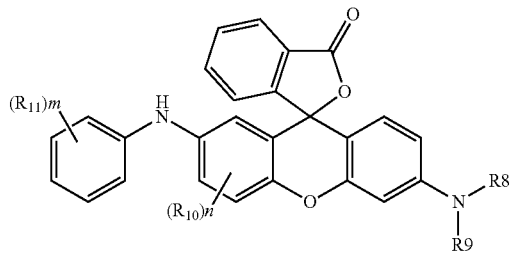

wherein R8 and R9 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group; R10 and R11 are independently selected from a substituted or unsubstituted alkyl group, a substituted or unsubstituted alkenyl group and a substituted or unsubstituted alkynyl group; n represents an integer from 0 to 3; and m represents an integer from 0 to 5.

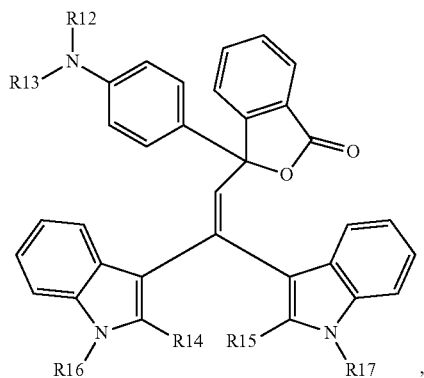

Formula (III)

wherein R12, R13, R16 and R17 are independently selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group; R14 and R15 are independently selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group.

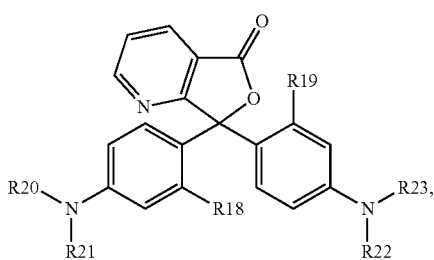

Formula (IV)

wherein R20 to R23 are independently selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group; R18 and R19 are independently selected from the group consisting of a hydrogen, a substituted or unsubstituted alkyl group and an alkoxy group.

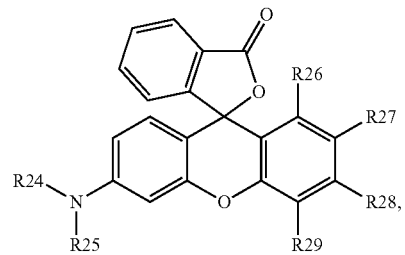

Formula (V)

wherein R24 and R25 are independently selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group; R26 to R29 are independently selected from the group consisting of a hydrogen, a substituted or unsubstituted alkyl group and a group formed by two of the groups R26 to R29 forming a substituted or unsubstituted aromatic ring.

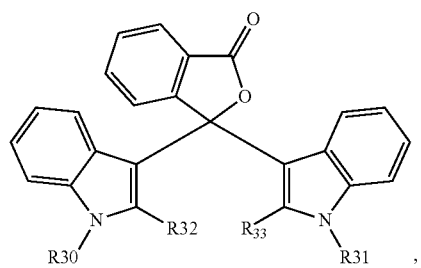

Formula (VII)

wherein R30 to R33 independently represent a group selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group.

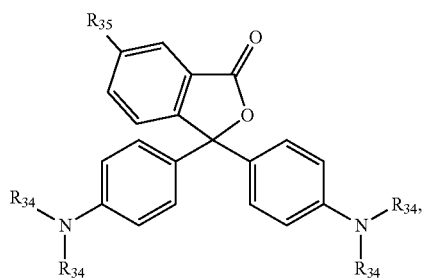

Formula (VIII)

wherein R34 is selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group; R35 is selected from the group consisting of a hydrogen, an alkoxy group, a dialkylamino group, a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group.

Typical examples of lactone based leuco dyes are given in Table 3 without being limited thereto.

TABLE 3

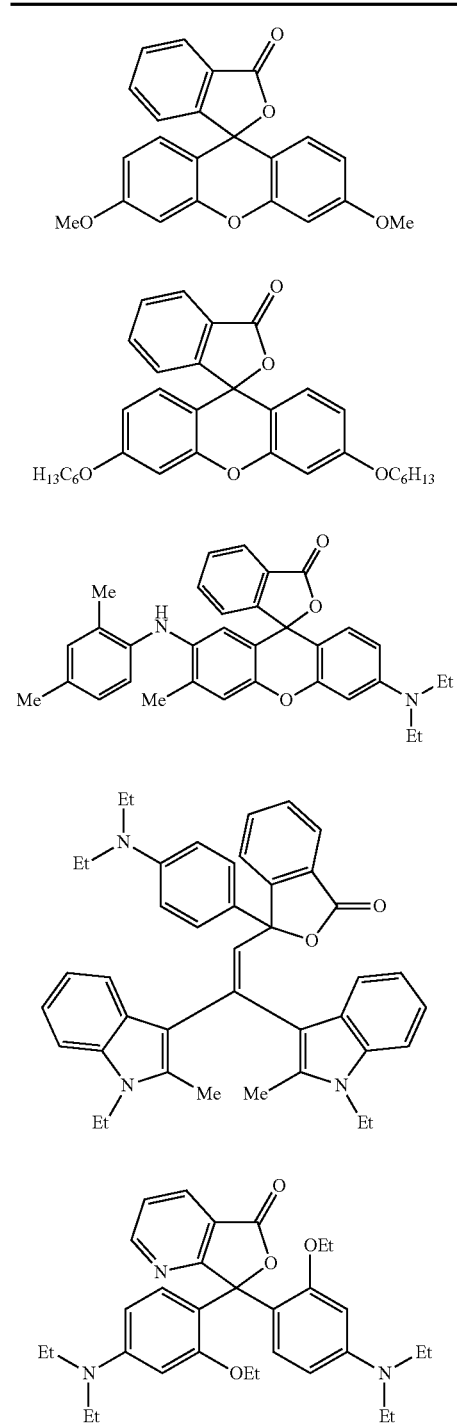

TABLE 3-continued

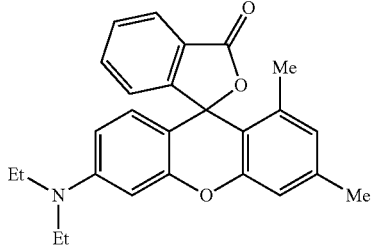 [SMILES: CCN(CC)c1ccc2c(c1)Oc1cc(C)cc(C)c1C21OC(=O)c2ccccc21]
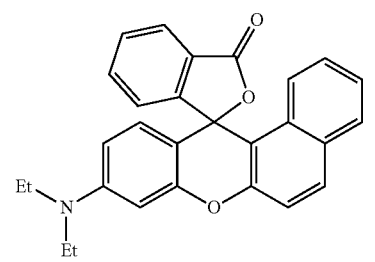 [SMILES: CCN(CC)c1ccc2c(c1)Oc1ccc3ccccc3c1C21OC(=O)c2ccccc21]
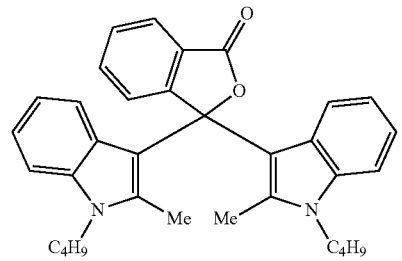
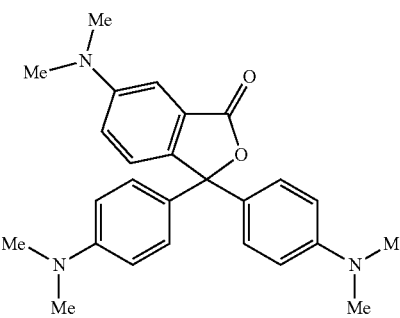

In a second preferred embodiment, the colorant is represented by a triaryl methane dye, more preferably a triaryl methane dye according to Formula (IX).

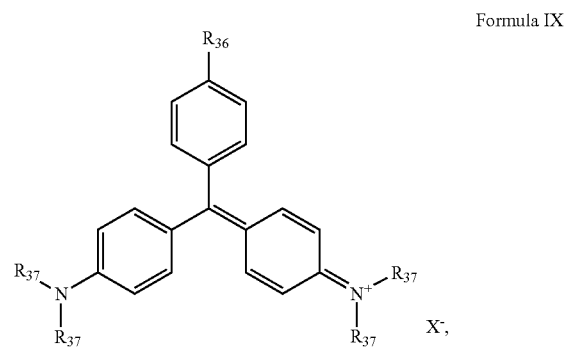

Formula IX wherein $R_{36}$ is selected from the group consisting of a hydrogen, a dialkylamino group, diarylamino group, an alkylarylamino group, an alkoxy group, a halogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group; R37 is selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group; and X represents a counterion to compensate the positive charge.

In a third preferred embodiment, the colorant is represented by a cyanine dye, a merocyanine dye and an oxonol dye. Cyanine dyes according to general formula (X) to (XIII) are particularly preferred.

Formula (X)

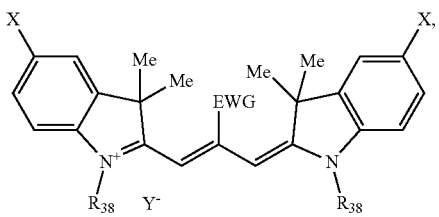

Formula (XI)

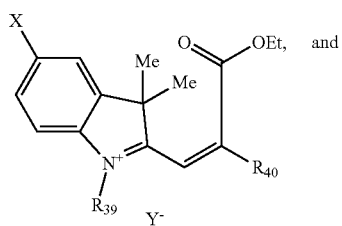

Formula (XII)

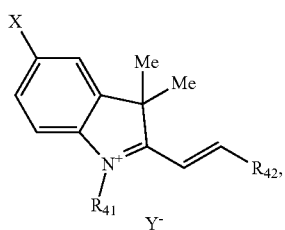

wherein X represents an group selected from a hydrogen, a nitrile, a nitro, a halogen and a sulfone; EWG represent an electron withdrawing group, preferably an ester group; R38, R39 and R41 independently represent a substituted or unsubstituted alky group; R40 and R42 are independently selected from the group consisting of a substituted or unsubstituted aryl group and a substituted or unsubstituted heteroaryl group; and Y represents a counterion to compensate the positive charge.

Other preferred colorants are represented by Formula (XIII) and (XIV):

Formula (XIII)

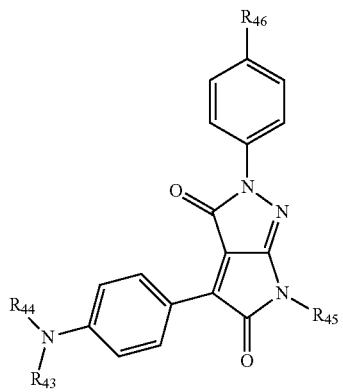

Formula (XIV)

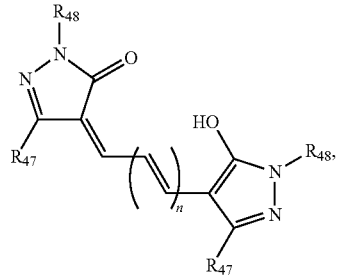

wherein R43, R44 and R45 are independently selected from the group consisting of, a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group; R46 is selected from the group consisting of a hydrogen, an alkoxy group, a halogen, a carboxy group or an ester thereof, a sulfonic acid or salt thereof, a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group; R47 is selected from the group consisting of a hydrogen, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted aryl or heteroaryl group, an amino group, an amide group and a sulphonamide group; R48 is selected from the group consisting of a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted aryl or heteroaryl group.

In a particularly preferred embodiment, the colorant comprises at least on substituent, capable of compatibilizing the colorant or its decolorized form with an aqueous stripping solution. This substituent capable of compatibilizing said colorant or its decolorized form is preferably selected from the group consisting of a carboxylic acid or salt thereof, a sulfonic acid or salt thereof, a phosphonic acid or salt thereof, a half ester of sulphuric acid or salt thereof, a mono- or diester of phosphoric acid or salt thereof, a phenolic group, an ethylene oxide group and a hydroxyl group, a carboxylic acid, a hydroxyl group and an ethylene oxide group being particularly preferred.

Typical colorants according to Formula (IX) to (XIV) are given in Table 4 without being limited thereto.

TABLE 4

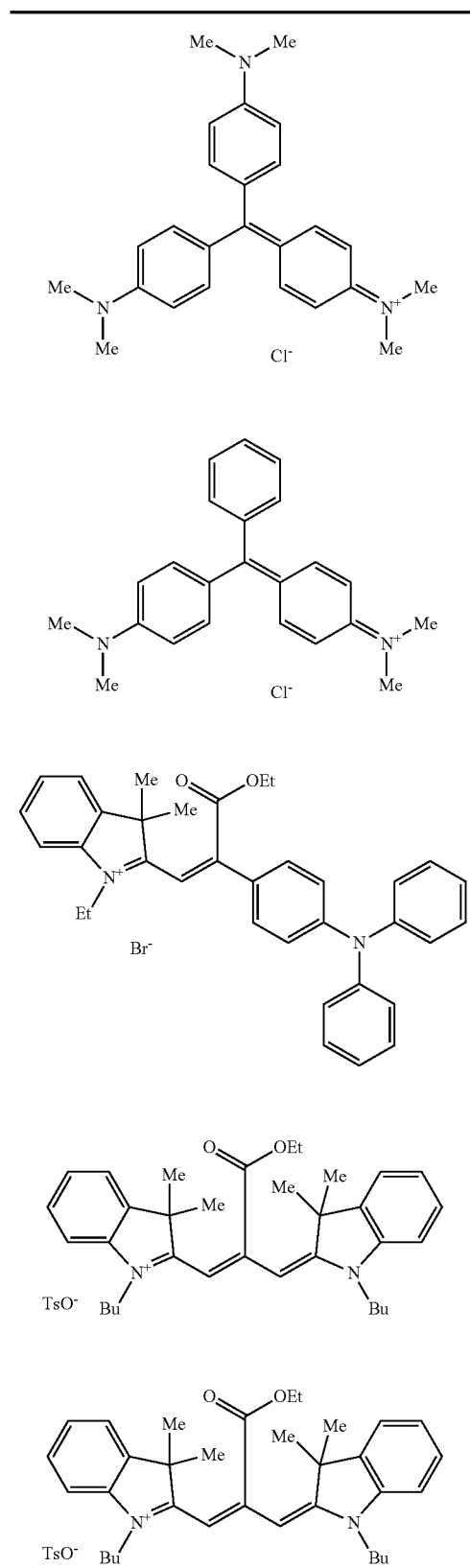

TABLE 4-continued

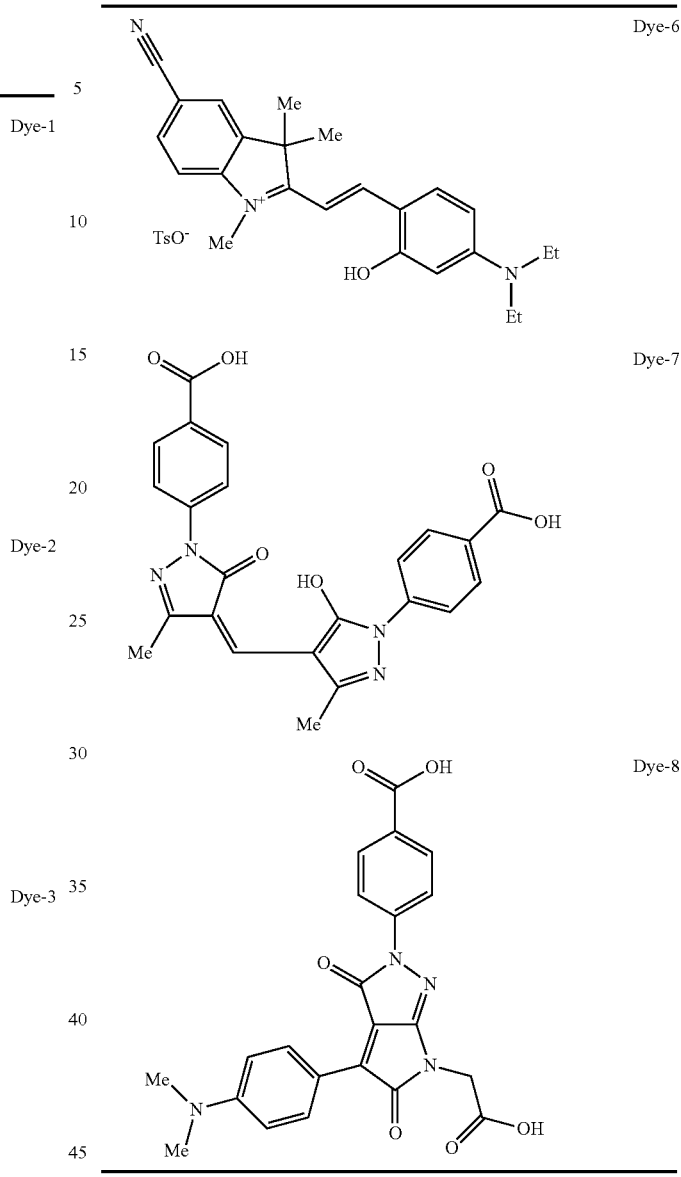

The colorant is present in the UV curable inkjet ink in an amount sufficient to impair visible colour to the cured ink pattern. Usually an amount of less than 2 wt %, more preferably less than 1 wt % based on the total weight of the UV curable inkjet ink suffices.

Photoinitiating System

The UV curable inkjet ink contains at least one photoinitiator, but may contain a photoinitiating system including a plurality of photoinitiators and/or co-initiators.

The photoinitiator in the UV curable inkjet ink is preferably a free radical initiator, more specifically a Norrish type I initiator or a Norrish type II initiator. A free radical photoinitiator is a chemical compound that initiates polymerization of monomers and oligomers when exposed to actinic radiation by the formation of a free radical. A Norrish Type I initiator is an initiator which cleaves after excitation, yielding the initiating radical immediately. A Norrish type II-initiator is a photoinitiator which is activated by actinic radiation and forms free radicals by hydrogen abstraction from a second compound that becomes the actual initiating free radical. This second compound is called a polymerization synergist or co-initiator. Both type I and type II photoinitiators can be used in the present invention, alone or in combination.

Suitable photoinitiators are disclosed in CRIVELLO, J. V., et al. Photoinitiators for Free Radical Cationic and Anionic Photopolymerization. 2nd edition. Edited by BRADLEY, G. London, UK: John Wiley and Sons Ltd, 1998. p.287-294.

Specific examples of photoinitiators may include, but are not limited to, the following compounds or combinations thereof: benzophenone and substituted benzophenones, 1-hydroxycyclohexyl phenyl ketone, thioxanthones such as isopropylthioxanthone, 2-hydroxy-2-methyl-1-phenylpropan-1-one, 2-benzyl-2-dimethylamino-(4-morpholinophenyl) butan-1-one, benzil dimethylketal, bis (2,6-dimethylbenzoyl)-2,4,4-trimethylpentylphosphine oxide, 2,4,6 trimethylbenzoyldiphenylphosphine oxide, 2,4,6-trimethoxybenzoyldiphenylphosphine oxide, 2-methyl-1-[4-(methylthio) phenyl]-2-morpholinopropan-1-one, 2,2-dimethoxy-1,2-diphenylethan-1-one or 5,7-diiodo-3-butoxy-6-fluorone.

Suitable commercial photoinitiators include Irgacure™ 184, Irgacure™ 500, Irgacure™ 369, Irgacure™ 1700, Irgacure™ 651, Irgacure™ 819, Irgacure™ 1000, Irgacure™ 1300, Irgacure™ 1870, Darocur™ 1173, Darocur™ 2959, Darocur™ 4265 and Darocur™ ITX available from CIBA SPECIALTY CHEMICALS, Lucerin™ TPO available from BASF AG, Esacure™ KT046, Esacure™ KIP150, Esacure™ KT37 and Esacure™ EDB available from LAMBERTI, H-Nu™ 470 and H-Nu™ 470X available from SPECTRA GROUP Ltd.

For safety reasons during manufacturing of a conductive pattern, the photoinitiator is preferably a so-called diffusion hindered photoinitiator. A diffusion hindered photoinitiator is a photoinitiator which exhibits a much lower mobility in a cured ink layer than a monofunctional photoinitiator, such as benzophenone. Several methods can be used to lower the mobility of the photoinitiator. One way is to increase the molecular weight of the photoinitiators so that the diffusion speed is reduced, e.g. polymeric photoinitiators. Another way is to increase its reactivity so that it is built into the polymerizing network, e.g. multifunctional photoinitiators (having 2, 3 or more photoinitiating groups) and polymerizable photoinitiators.

The diffusion hindered photoinitiator for the UV curable inkjet ink is preferably selected from the group consisting of non-polymeric multifunctional photoinitiators, oligomeric or polymeric photoinitiators and polymerizable photoinitiators. Most preferably the diffusion hindered photoinitiator is a polymerizable initiator or a polymeric photoinitiator.

A preferred diffusion hindered photoinitiator contains one or more photoinitiating functional groups derived from a Norrish type I-photoinitiator selected from the group consisting of benzoinethers, benzil ketals, α,α-dialkoxyacetophenones, α-hydroxyalkylphenones, α-aminoalkylphenones, acylphosphine oxides, acylphosphine sulphides, α-haloketones, α-halosulfones and phenylglyoxalates.

A preferred diffusion hindered photoinitiator contains one or more photoinitiating functional groups derived from a Norrish type II-initiator selected from the group consisting of benzophenones, thioxanthones, 1,2-diketones and anthraquinones.

Suitable diffusion hindered photoinitiators are also those disclosed in EP 2065362 A (AGFA) in paragraphs [0074] and [0075] for difunctional and multifunctional photoinitiators, in paragraphs [0077] to [0080] for polymeric photoinitiators and in paragraphs [0081] to [0083] for polymerizable photoinitiators.

A preferred amount of photoinitiator is 0-50 wt %, more preferably 0.1-20 wt %, and most preferably 0.3-15 wt % of the total weight of the UV curable inkjet ink preferably also contains an initiator.

In order to increase the photosensitivity further, the UV curable inkjet ink may additionally contain co-initiators. Suitable examples of co-initiators can be categorized in three groups: 1) tertiary aliphatic amines such as methyldiethanolamine, dimethylethanolamine, triethanolamine, triethylamine and N-methylmorpholine; (2) aromatic amines such as amylparadimethylaminobenzoate, 2-n-butoxyethyl-4-(dimethylamino) benzoate, 2-(dimethylamino)ethylbenzoate, ethyl-4-(dimethylamino)benzoate, and 2-ethylhexyl-4-(dimethylamino)benzoate; and (3) (meth)acrylated amines such as dialkylamino alkyl(meth)acrylates (e.g., diethylaminoethylacrylate) or N-morpholinoalkyl-(meth)acrylates (e.g., N-morpholinoethyl-acrylate). The preferred co-initiators are aminobenzoates.

When one or more co-initiators are included into the UV curable inkjet ink, preferably these co-initiators are diffusion hindered for safety reasons.

A diffusion hindered co-initiator is preferably selected from the group consisting of non-polymeric di- or multifunctional co-initiators, oligomeric or polymeric co-initiators and polymerizable co-initiators. More preferably the diffusion hindered co-initiator is selected from the group consisting of polymeric co-initiators and polymerizable co-initiators. Most preferably the diffusion hindered co-initiator is a polymerizable co-initiator having at least one (meth) acrylate group, more preferably having at least one acrylate group.

The UV curable inkjet ink preferably includes a polymerizable or polymeric tertiary amine co-initiator.

Preferred diffusion hindered co-initiators are the polymerizable co-initiators disclosed in EP 2053101 A (AGFA) in paragraphs [0088] and [0097].

The UV curable inkjet inks preferably includes the (diffusion hindered) co-initiator in an amount of 0.1 to 50 wt %, more preferably in an amount of 0.5 to 25 wt %, most preferably in an amount of 1 to 15 wt % of the total weight of the UV curable inkjet ink.

Polymerization Inhibitors

The UV curable inkjet ink may contain a polymerization inhibitor. Suitable polymerization inhibitors include phenol type antioxidants, hindered amine light stabilizers, phosphor type antioxidants, hydroquinone monomethyl ether commonly used in (meth)acrylate monomers, and hydroquinone, t-butylcatechol, pyrogallol may also be used.

Suitable commercial inhibitors are, for example, Sumilizer™ GA-80, Sumilizer™ GM and Sumilizer™ GS produced by Sumitomo Chemical Co. Ltd.; Genorad™ 16, Genorad™ 18 and Genorad™ 20 from Rahn AG; Irgastab™ UV10 and Irgastab™ UV22, Tinuvin™ 460 and CGS20 from Ciba Specialty Chemicals; Floorstab™ UV range (UV-1, UV-2, UV-5 and UV-8) from Kromachem Ltd, Additol™ S range (S100, S110, S120 and S130) from Cytec Surface Specialties.

Since excessive addition of these polymerization inhibitors will lower the ink sensitivity to curing, it is preferred that the amount capable of preventing polymerization is determined prior to blending. The amount of a polymerization inhibitor is preferably lower than 2 wt % of the total weight of the UV curable inkjet ink.

Polymeric Dispersants

If the colorant in the UV curable inkjet ink is a pigment, then the UV curable inkjet ink preferably contains a dispersant, more preferably a polymeric dispersant, for dispersing the pigment.

Suitable polymeric dispersants are copolymers of two monomers but they may contain three, four, five or even more monomers. The properties of polymeric dispersants depend on both the nature of the monomers and their distribution in the polymer. Copolymeric dispersants preferably have the following polymer compositions:
- statistically polymerized monomers (e.g. monomers A and B polymerized into ABBAABAB);
- alternating polymerized monomers (e.g. monomers A and B polymerized into ABABABAB);
- gradient (tapered) polymerized monomers (e.g. monomers A and B polymerized into AAABAABBABBB);
- block copolymers (e.g. monomers A and B polymerized into AAAAABBBBBB) wherein the block length of each of the blocks (2, 3, 4, 5 or even more) is important for the dispersion capability of the polymeric dispersant;
- graft copolymers (graft copolymers consist of a polymeric backbone with polymeric side chains attached to the backbone); and
- mixed forms of these polymers, e.g. blocky gradient copolymers.

Suitable polymeric dispersants are listed in the section on "Dispersants", more specifically [0064] to [0070] and [0074] to [0077], in EP 1911814 A (AGFA).

Commercial examples of polymeric dispersants are the following:
- DISPERBYK™ dispersants available from BYK CHEMIE GMBH;
- SOLSPERSE™ dispersants available from NOVEON;
- TEGO™ DISPERS™ dispersants from EVONIK;
- EDAPLAN™ dispersants from MUNZING CHEMIE;
- ETHACRYL™ dispersants from LYONDELL;
- GANEX™ dispersants from ISP;
- DISPEX™ and EFKA™ dispersants from CIBA SPECIALTY CHEMICALS INC;
- DISPONER™ dispersants from DEUCHEM; and
- JONCRYL™ dispersants from JOHNSON POLYMER.

Surfactants

The UV curable inkjet ink may contain at least one surfactant, but preferably no surfactant is present. If no surfactant is present, the UV curable inkjet ink does not spread well on the metal sheet allowing the generation of thin conductive lines.

The surfactant can be anionic, cationic, non-ionic, or zwitter-ionic and is usually added in a total quantity less than 1 wt % based on the total weight of the UV curable inkjet ink.

Suitable surfactants include fluorinated surfactants, fatty acid salts, ester salts of a higher alcohol, alkylbenzene sulfonate salts, sulfosuccinate ester salts and phosphate ester salts of a higher alcohol (for example, sodium dodecylbenzenesulfonate and sodium dioctylsulfosuccinate), ethylene oxide adducts of a higher alcohol, ethylene oxide adducts of an alkylphenol, ethylene oxide adducts of a polyhydric alcohol fatty acid ester, and acetylene glycol and ethylene oxide adducts thereof (for example, polyoxyethylene nonylphenyl ether, and SURFYNOL™ 104, 104H, 440, 465 and TG available from AIR PRODUCTS & CHEMICALS INC.).

Preferred surfactants are selected from fluoro surfactants (such as fluorinated hydrocarbons) and silicone surfactants.

The silicone surfactants are preferably siloxanes and can be alkoxylated, polyether modified, polyether modified hydroxy functional, amine modified, epoxy modified and other modifications or combinations thereof. Preferred siloxanes are polymeric, for example polydimethylsiloxanes.

Preferred commercial silicone surfactants include BYK™ 333 and BYK™ UV3510 from BYK Chemie.

In a preferred embodiment, the surfactant is a polymerizable compound.

Preferred polymerizable silicone surfactants include a (meth)acrylated silicone surfactant. Most preferably the (meth)acrylated silicone surfactant is an acrylated silicone surfactant, because acrylates are more reactive than methacrylates.

In a preferred embodiment, the (meth)acrylated silicone surfactant is a polyether modified (meth)acrylated polydimethylsiloxane or a polyester modified (meth)acrylated polydimethylsiloxane.

Preparation of Inkjet Inks

The preparation of pigmented UV curable inkjet inks is well-known to the skilled person. Preferred methods of preparation are disclosed in paragraphs [0076] to [0085] of WO 2011/069943 (AGFA).

Inkjet Printing Devices

The UV curable inkjet ink may be jetted by one or more print heads ejecting small droplets in a controlled manner through nozzles onto a substrate, which is moving relative to the print head(s).

A preferred print head for the inkjet printing system is a piezoelectric head. Piezoelectric inkjet printing is based on the movement of a piezoelectric ceramic transducer when a voltage is applied thereto. The application of a voltage changes the shape of the piezoelectric ceramic transducer in the print head creating a void, which is then filled with ink. When the voltage is again removed, the ceramic expands to its original shape, ejecting a drop of ink from the print head. However the inkjet printing method according to the present invention is not restricted to piezoelectric inkjet printing. Other inkjet print heads can be used and include various types, such as a continuous type.

The inkjet print head normally scans back and forth in a transversal direction across the moving ink-receiver surface. Often the inkjet print head does not print on the way back. Bi-directional printing is preferred for obtaining a high areal throughput. Another preferred printing method is by a "single pass printing process", which can be performed by using page wide inkjet print heads or multiple staggered inkjet print heads which cover the entire width of the ink-receiver surface. In a single pass printing process the inkjet print heads usually remain stationary and the substrate surface is transported under the inkjet print heads.

Curing Devices

The UV curable inkjet ink can be cured by exposing them to actinic radiation, preferably by ultraviolet radiation.

In inkjet printing, the curing means may be arranged in combination with the print head of the inkjet printer, travelling therewith so that the curable liquid is exposed to curing radiation very shortly after been jetted.

In such an arrangement it can be difficult to provide a small enough radiation source connected to and travelling with the print head, such as LED. Therefore, a static fixed radiation source may be employed, e.g. a source of curing UV-light, connected to the radiation source by means of flexible radiation conductive means such as a fiber optic bundle or an internally reflective flexible tube.

Alternatively, the actinic radiation may be supplied from a fixed source to the radiation head by an arrangement of mirrors including a mirror upon the radiation head.

The source of radiation may also be an elongated radiation source extending transversely across the substrate to be cured. It may be adjacent the transverse path of the print head so that the subsequent rows of images formed by the print head are passed, stepwise or continually, beneath that radiation source.

Any ultraviolet light source, as long as part of the emitted light can be absorbed by the photo-initiator or photo-initiator system, may be employed as a radiation source, such as, a high or low pressure mercury lamp, a cold cathode tube, a black light, an ultraviolet LED, an ultraviolet laser, and a flash light. Of these, the preferred source is one exhibiting a relatively long wavelength UV-contribution having a dominant wavelength of 300-400 nm. Specifically, a UV-A light source is preferred due to the reduced light scattering therewith resulting in more efficient interior curing.

UV radiation is generally classed as UV-A, UV-B, and UV-C as follows:

UV-A: 400 nm to 320 nm
UV-B: 320 nm to 290 nm
UV-C: 290 nm to 100 nm.

In a preferred embodiment, the UV curable inkjet ink is cured by UV LEDs. The inkjet printing device preferably contains one or more UV LEDs preferably with a wavelength larger than 360 nm, preferably one or more UV LEDs with a wavelength larger than 380 nm, and most preferably UV LEDs with a wavelength of about 395 nm.

Furthermore, it is possible to cure the ink pattern using, consecutively or simultaneously, two light sources of differing wavelength or illuminance. For example, the first UV-source can be selected to be rich in UV-C, in particular in the range of 260 nm-200 nm. The second UV-source can then be rich in UV-A, e.g. a gallium-doped lamp, or a different lamp high in both UV-A and UV-B. The use of two UV-sources has been found to have advantages e.g. a fast curing speed and a high curing degree.

For facilitating curing, the inkjet printing device often includes one or more oxygen depletion units. The oxygen depletion units place a blanket of nitrogen or other relatively inert gas (e.g. $CO_2$), with adjustable position and adjustable inert gas concentration, in order to reduce the oxygen concentration in the curing environment. Residual oxygen levels are usually maintained as low as 200 ppm, but are generally in the range of 200 ppm to 1200 ppm.

Substrates

There is no real limitation on the type of substrate bonded to the metal sheet as long as it is non-conductive. The substrates may be made of a ceramic, glass or plastics such as polyimides. The metal sheet, usually having a thickness between 9 and 35 μm, bonded to the substrate is preferably a copper sheet, because copper has a high conductivity and is relatively cheap.

Preferred embodiments of the invention are of especial use in forming a pattern on a copper clad board, such as variable information or the circuit itself, and then etching the board to obtain the variable information or printed circuit.

EXAMPLES

Materials

All materials used in the following examples were readily available from standard sources such as ALDRICH CHEMICAL Co. (Belgium) and ACROS (Belgium) unless otherwise specified. The water used was deionized water.

Macrolex™ Blue 3R is a blue anthraquinone dye from LANXESS.

ITX is an isomeric mixture of 2- and 4-isopropylthioxanthone available as Darocur™ ITX from BASF.

IC907 is 2-methyl-1-[4-(methylthio)phenyl]-2-morpholino-propan-1-one, a photoinitiator available as Irgacure™ 907 from BASF.

IC819 is bis(2,4,6-trimethylbenzoyl)-phenylphosphineoxide, a photoinitiator available as Irgacure™ 819 from BASF.

TPO is 2,4,6-trimethylbenzoyl-diphenyl-phosphineoxide, a photoinitiator available as Darocur™ TPO from BASF.

Stabi-1 is a mixture forming a polymerization inhibitor having a composition according to Table 5:

TABLE 5

| Component | wt % |
|---|---|
| DPGDA | 82.4 |
| p-methoxyphenol | 4.0 |
| 2,6-di-tert-butyl-4-methylphenol | 10.0 |
| Cupferron ™ AL | 3.6 |

Cupferron™ AL is aluminium N-nitrosophenylhydroxylamine from WAKO CHEMICALS LTD.

VEEA or 2-(2-vinyloxy-ethoxy)-ethyl acrylate was supplied by Nippon Shokubai.

4-hydroxybutyl acrylate was supplied by Nippon Kasei.

PETTA is pentaerythritol tetraacylate available as SR295 from SARTOMER.

ACMO is acryloyl morpholine available from RAHN AG.

Crystal violet is a triarylmethane dye from ALDRICH.

PEG200DA is polyethylene glycol (MW200) diacrylate available as Sartomer™ SR259 from SARTOMER having n=4:

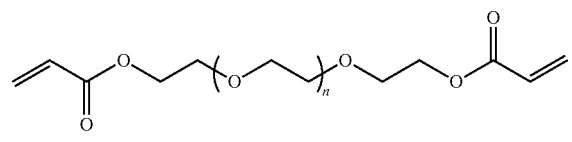

PEG200DA

HDDA is 1,6-hexanediol diacrylate available as Sartomer™ SR238 from SARTOMER:

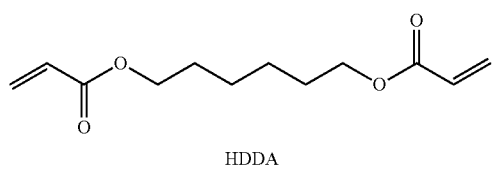

HDDA

HYDRO-8 is an oxalate monomer similar to PEG200DA:

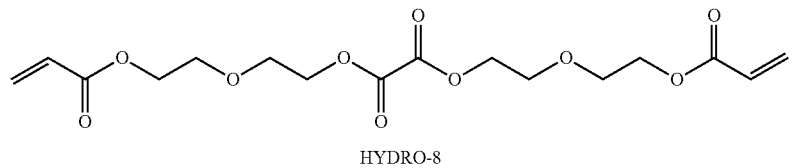 [SMILES: C=CC(=O)OCCOCCOC(=O)C(=O)OCCOCCOC(=O)C=C]

HYDRO-8

The synthesis of oxalic acid bis-[2-(2-acryloyloxy-ethoxy)-ethyl]ester (HYDRO-8) was performed as follows.

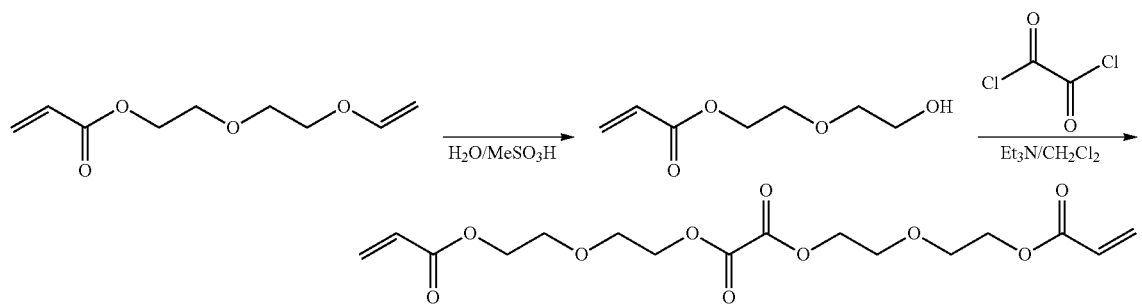

First Step: Synthesis of 2-(2-hydroxy-ethoxy)-ethyl acrylate 55.9 g (0.3 mol) 2-(2-vinyloxy-ethoxy)-ethyl acrylate was dissolved in 100 ml acetone. 27 g (1.5 mol) water and 0.6 g (6 mmol) methane sulfonic acid was added. The reaction was allowed to continue for 4 hours at room temperature. The reaction mixture was diluted with 500 ml methylene chloride and extracted with 250 ml water. The organic fraction was dried over $MgSO_4$ and evaporated under reduced pressure. 2-(2-hydroxy-ethoxy)-ethyl acrylate was analyzed using TLC-chromatography (Partisil KC18F, supplied by Whatman, eluent: methanol/0.5 N NaCl 80/20, $R_f$: 0.83, only traces of (2-vinyloxy-ethoxy)-ethyl acrylate, $R_f$: 0.66 and a compound according to the following structure, $R_f$: 0.9).

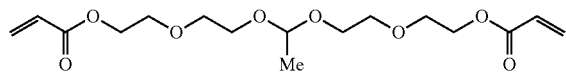 [SMILES: C=CC(=O)OCCOCCOC(C)OCCOCCOC(=O)C=C]

2-(2-hydroxy-ethoxy)-ethyl acrylate was used without further purification.

Second Step: Synthesis of oxalic acid bis-[2-(2-acryloyloxy-ethoxy)-ethyl]ester 30.4 g (0.19 mol) of 2-(2-hydroxy-ethoxy)-ethyl acrylate, 19.8 g (0.196 mol) triethyl amine and 1.3 g (5.7 mmol) BHT were dissolved in 140 ml methylene chloride. The solution was cooled to −10° C. A solution of 12.1 g (0.095 mol) oxalyl chloride in 70 ml methylene chloride was added drop wise, while maintaining the temperature at −10° C. The reaction was allowed to continue for 1 hour at 0° C., followed by reaction at room temperature for 16 hours. The reaction mixture was added to 200 g ice and the mixture was extracted with 200 ml methylene chloride. The organic fraction was extracted with 200 ml of a 1N hydrochloric acid solution, 200 ml of a saturated $NaHCO_3$ solution and 200 ml of brine. The organic fraction was dried over $MgSO_4$ and evaporated under reduced pressure. The crude product was purified, using preparative column chromatography using a Prochrom LC80 column, packed with packed with Kromasil Si 60 å 10 μm and methylene chloride/ethyl acetate 90/10 as eluent. 19.1 g of oxalic acid bis-[2-(2-acryloyloxy-ethoxy)-ethyl]ester was isolated (y: 54%). The compound was analyzed using TLC-chromatography (TLC Silica gel 60 $F_{254}$, supplied by Merck, eluent: methylene chloride/ethyl acetate, 83/17, $R_f$: 0.42) and LC-MS, according to the method described below (retention time: 6.6 min, purity 96.2 area %).

HYDRO-11 OXAL-2 is an oxalate monomer similar to HDDA:

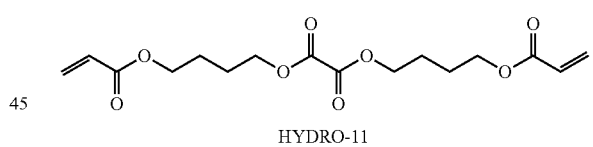

HYDRO-11

The synthesis of oxalic acid bis-(4-acryloyloxy-butyl)ester (HYDRO-11) was performed as follows.

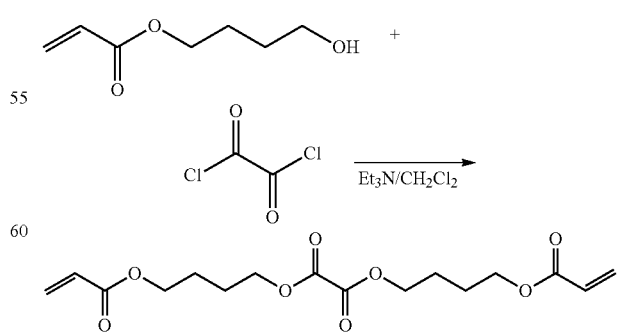

51.3 g (0.3 mol) 4-hydroxy-butyl acrylate, 31.4 g (0.31 mol) triethyl amine and 2 g (9 mmol) BHT were dissolved in 200 ml methylene chloride. The reaction mixture was cooled to −10° C. A solution of 19.0 g (0.15 mol) oxalyl chloride in 100 ml methylene chloride was added drop wise while maintaining the temperature at −10° C. The reaction was allowed to continue for 1 hour at 0° C., followed by reaction at room temperature for 16 hours. The reaction mixture was poured into 500 g ice and the mixture stirred for 1 hour. The mixture was extracted twice with 200 ml methylene chloride. The pooled organic fractions were extracted with 300 ml of a 1 N hydrochloric acid solution, 300 ml of a saturated $NaHCO_3$ solution and twice with 200 ml of brine. The organic fraction was dried over $MgSO_4$ and evaporated under reduced pressure. The crude product was purified, using preparative column chromatography using a Prochrom LC80 column, packed with packed with Kromasil Si 60 å 10 μm and methylene chloride/ethyl acetate 90/10 as eluent. 22 g of oxalic acid bis-(4-acryloyloxy-butyl)ester was isolated (y: 43%). The compound was analyzed, using TLC chromatography (TLC Silica gel 60 $F_{254}$, supplied by Merck, eluent: methylene chloride/ethyl acetate 96/4, $R_f$: 0.3), GC (retention time: 12.2 min, purity: 99.6 area %), and GC-MS, both according to the method described below.

PEA is 2-phenoxyethyl acrylate available as Sartomer™ SR339C from SARTOMER.

M170 is 2-(2-ethoxy)ethyl acrylate (CASRN 7328-17-8) available as Miramer™ 170 from RAHN AG.

Isola™ 400 is a Cu-plate available from CCI Eurolam having a metal surface consisting of an 18μ Cu-laminate.

Measurement Methods

1. GC Analysis

The GC analysis was done on an Agilent 6890, using a DB1 column (30×0.25 0.25), helium as carrier gas at a flow rate of 2 ml/min and a split ratio of 50 to 1. A temperature profile was used, starting at 40° C. for 2 minutes and a temperature increase of 15° C. per minute up to a temperature of 200° C. 1 μl of a 1 w/w % solution of each compound in methylene chloride was injected.

2. GC-MS Analysis

The GC-MS analysis was done on a Trace Ultra-DSQ, using a DB-xlb column (30×0.25 0.25), helium as carrier gas at a flow rate of 1.2 ml/min and a split ratio of 50 to 1. A temperature profile was used starting at 80° C. and a temperature increase of 15° C. per minute up to 325° C. EI an $PCI_{(ammonia)}$ was used for recording the mass spectra. 1 μl of a 1 w/w % solution of each compound in methylene chloride was injected.

3. LC-MS Analysis

The LC-MS analysis was done on a Bruker HG Ultra, using an Altima HP C18 AQ column (150×3, 5 μm), operating at a flow rate of 0.35 ml/min and at 40° C. A gradient elution was used, with water as eluent A and acetonitrile as eluent B. The gradient according to Table 6 was used.

TABLE 6

| Time | % B |
|------|-----|
| 0    | 45  |
| 6    | 45  |
| 11   | 100 |
| 30   | 100 |
| 31   | 45  |
| 38   | 45  |

ESI ionisation was used in combination with a combibron detector. 5 μl of a solution of 2 mg of each compound in 20 ml acetonitrile was injected.

4. Flow Injection-MS:

The flow injection analysis was done on a Bruker HG Ultra, using a mixture of 95% acetonitrile and 5% of 2 mmol ammonium acetate solution in water as eluent at a flow rate of 0.1 ml/min and a temperature of 40° C. ESI negative was used as ionisation. 2 μl of a solution of 2 mg of each compound in 20 ml acetonitrile was injected.

5. Etch Resistance

The etch resistance was evaluated by the determining the percentage of the cured inkjet ink layer that remained on the copper plate after etching. An etch resistance of 100% means that the whole cured inkjet ink layer survived the etching bath. An etch resistance of 0% means that no cured inkjet ink could be found to be present on the copper plate after etching. An intermediate percentage, e.g. 80% means that about 80% of the cured inkjet ink could be found to be present on the copper plate after etching. A good etch resistance means a value of at least 80%. Excellent etch resistance means a value of at least 90% but preferably 100%.

6. Strippability

The strippability was evaluated by the determining the percentage of the cured inkjet ink layer that was removed from the copper plate after stripping. A strippability of 100% means that the whole cured inkjet ink layer was removed. A strippability of 0% means that no cured inkjet ink could be removed from the copper plate. An intermediate percentage, e.g. 30% means that only about 30% of the cured inkjet ink could be removed from the copper plate by stripping. A good strippability means a value of at least 80%. Excellent strippability means a value of at least 90% but preferably 100%. A value of 30% or less is a very poor strippability.

7. Viscosity

The viscosity of the formulations was measured at 45° C. using a "Robotic Viscometer Type VISCObot" from CAMBRIDGE APPLIED SYSTEMS.

For industrial inkjet printing, the viscosity is preferably less than 20 mPa·s at 45° C. More preferably the viscosity is less than 15 mPa·s at 45° C.

8. Curing Speed

A radiation curable inkjet ink was coated on a PET100 substrate using a bar coater and a 10 μm wired bar. The coated sample was cured using a Fusion DRSE-120 conveyer, equipped with a Fusion VPS/1600 lamp (D-bulb), which transported the samples under the UV-lamp on a conveyer belt at a speed of 20 m/min. The maximum output of the lamp was 1.05 $J/cm^2$ and a peak intensity of 5.6 $W/cm^2$. The percentage of the maximum output of the lamp was taken as a measure for curing speed, the lower the number the higher the curing speed. A sample was considered as fully cured at the moment scratching with a Q-tip caused no visual damage.

Example 1

This example illustrates how conductive patterns are prepared without the necessity to filter out flakes of the cured ink pattern.

Preparation of the UV Curable Inkjet Inks

The comparative UV curable inkjet ink COMP-1 and COMP-2 and the inventive UV curable ink INV-1 to INV-3 were prepared according to Table 7. The weight percentage (wt %) was based on the total weight of the UV curable inkjet ink. The UV curable inkjet ink COMP-1 lacks a hydrolyzable polyfunctional monomer or oligomer, while the UV curable inkjet ink COMP-2 lacks a water absorption controlling monomer.

TABLE 7

| wt % of component: | COMP-1 | COMP-2 | INV-1 | INV-2 | INV-3 |
|---|---|---|---|---|---|
| Macrolex ™ Blue 3R | 1.75 | 1.75 | 1.75 | 1.75 | 1.75 |
| ITX | 5.00 | 5.00 | 5.00 | 5.00 | 5.00 |
| IC907 | 5.00 | 5.00 | 5.00 | 5.00 | 5.00 |
| IC819 | 3.00 | 3.00 | 3.00 | 3.00 | 3.00 |
| TPO | 2.00 | 2.00 | 2.00 | 2.00 | 2.00 |
| Stabi-1 | 1.00 | 1.00 | 1.00 | 1.00 | 1.00 |
| PEG200DA | 52.25 | — | — | — | — |
| HDDA | 30.00 | — | — | — | — |
| VEEA | — | — | — | — | 20.00 |
| PETTA | — | — | — | 26.00 | — |
| ACMO | — | — | 52.25 | 26.25 | — |
| HYDRO-8 | — | 52.25 | — | — | 32.25 |
| HYDRO-11 | — | 30.00 | 30.00 | 30.00 | 30.00 |

Evaluation and Results

Isola™ 400 copper plates were cleaned for 5 seconds at 25° C. with a solution called Mecbrite™ CA-95 from MEC Europe, which has pH<1 and contained $H_2SO_4$, $H_2O_2$ and $Cu^{2+}$. During this operation a thin top layer of Cu (0.3-0.5 μm) was removed. The plates were then rinsed with a water jet for 90 seconds.

A pattern of the UV curable inkjet inks COMP-1, COMP-2 and INV-1 to INV-3 was applied at a thickness of 10 μm on the copper plate and cured by a Fusion DRSE-120 conveyer, equipped with a Fusion VPS/1600 lamp (D-bulb), which transported the samples for full curing twice under the UV-lamp on a conveyer belt at a speed of 20 m/min. The maximum output of the lamp was 1.05 $J/cm^2$ and a peak intensity of 5.6 $W/cm^2$.

The plates were subjected to an acidic etch bath ("Mega" acid etchant obtained from Mega Electronics, pH 2, contains $FeCl_3$) for 75 seconds at 35° C. The plates were subsequently rinsed for 90 seconds with water and dried. An evaluation of the etch resistance was then made as shown in Table 8.

The etched copper plates were subjected for 5 minutes at 50° C. to an alkaline strip bath (containing 5% NaOH), then rinsed for 90 seconds with water, dried, and evaluated for strippability and the shape of the stripped ink layer. The results are shown in Table 8.

TABLE 8

| UV Curable Inkjet Ink | Etch Resistance | Stripping (after 5 min) | |
|---|---|---|---|
| | | Strippability | Visual Shape |
| COMP-1 | 100% | 100% | large flakes |
| COMP-2 | 100% | 100% | small flakes |
| INV-1 | 100% | 100% | fully dissolved |
| INV-2 | 100% | 100% | fully dissolved |
| INV-3 | 100% | 100% | fully dissolved |

From Table 8, it should be clear that the UV curable inkjet inks INV-1 to INV-3 provided results for etch resistance and strippability that are comparable to those of the comparative UV curable inkjet inks COMP-1 and COMP-2, with the exception that the cured ink pattern in the alkaline stripping bath fully dissolved into a blue colored liquid within 5 minutes.

It was found that by replacing the colorant Macrolex™ Blue 3R by crystal violet that the colored cured ink pattern in the alkaline stripping bath fully dissolved into a colourless liquid within 5 minutes. By using crystal violet as a dye that decolorizes at a pH of more than 10, two advantageous effects were obtained. Firstly, the cured ink pattern could be visually inspected before etching. Secondly, when the stripping solutions starts to get colored after multiple strippings, this forms an indication to replace the stripping solution.

The invention claimed is:

1. A method of manufacturing a conductive pattern comprising the steps of:
   printing and curing a UV curable inkjet ink to define a cured inkjet ink pattern on a metal sheet bonded to a non-conductive substrate;
   etching the metal sheet not covered by the cured inkjet ink pattern to expose the non-conductive substrate; and
   dissolving the cured inkjet ink pattern within 5 minutes with an alkaline solution; wherein
   the UV curable inkjet ink includes:
   one or more photoinitiators;
   a colorant that decolorizes at a pH of more than 10;
   one or more hydrolyzable polyfunctional monomers or oligomers including at least one alkali hydrolyzable group located in an atomic clain between two polymerizable groups of the hydrolyzable polyfunctional monomer or oligomer; and
   one or more water absorption controlling monomers including a monofunctional or difunctional monomer containing at least one functional group selected from the group consisting of a hydroxyl group, an ethylene oxide or oligo-ethylene oxide group, a tertiary amine group, an acidic group having a $pK_a$ not lower than 3, and a five to seven membered aromatic or non-aromatic heterocyclic group;
   the at least one alkali hydrolyzable group located in the atomic chain between the two polymerizable groups of the hydrolyzable polyfunctional monomer or oligomer is selected from the group consisting of Formulas H-1 to H-4:

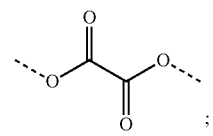

H-1

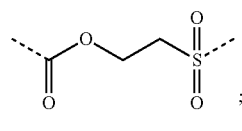

H-2

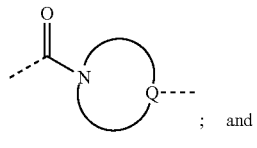

H-3

; and

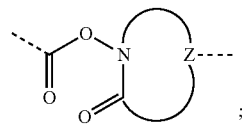

H-4

Q represents necessary atoms to form a five membered aromatic ring group;
Z represents necessary atoms to form a five or six membered ring group; and the dashed lines represent bonds to remaining portions of the hydrolyzable polyfunctional monomer or oligomer.

2. The method according to claim 1, wherein the metal sheet is a copper sheet.

3. The method according to claim 1, wherein the colorant includes a dye which decolorizes at a pH of more than 10.

4. The method according to claim 1, wherein the step of curing the UV curable inkjet ink includes curing the UV curable inkjet ink using UV LEDs.

5. The method according to claim 1, wherein the cured inkjet ink pattern has a thickness of less than 40 μm.

6. The method according to claim 1, wherein the two polymerizable groups of the hydrolyzable polyfunctional monomer or oligomer are independently selected from the group consisting of an acrylate group, a methacrylate group, an acrylamide group, a methacrylamide group, a styrene group, a maleate group, a fumarate group, an itaconate group, a vinyl ether group, a vinyl ester group, an allyl ether group, and an allyl ester group.

7. The method according to claim 1, wherein the at least one alkali hydrolyzable group H-3 is selected from the group consisting of an imidazole group, a benzimidazole group, a triazole group, and a benzotriazole group; and
the at least one alkali hydrolyzable group H-4 is selected from the group consisting of an succinimid group and a phtalimid group.

8. The method according to claim 1, wherein the hydrolyzable polyfunctional monomer or oligomer is a difunctional polyfunctional monomer or oligomer.

9. A UV curable inkjet ink comprising:
one or more photoinitiators;
a colorant that decolorizes at a pH of more than 10;
one or more hydrolyzable polyfunctional monomers or oligomers including at least one alkali hydrolyzable group located in an atomic clain between two polymerizable groups of the one or more hydrolyzable polyfunctional monomers or oligomers; and
one or more water absorption controlling monomers including a monofunctional or difunctional monomer containing at least one functional group selected from the group consisting of a hydroxyl group, an ethylene oxide or oligo-ethylene oxide group, a tertiary amine group, an acidic group having a $pK_a$ not lower than 3, and a five to seven membered aromatic or non-aromatic heterocyclic group; wherein
the at least one alkali hydrolyzable group located in the atomic chain between the two polymerizable groups of the hydrolyzable polyfunctional monomer or oligomer is selected from the group consisting of Formulas H-1 to H-4:

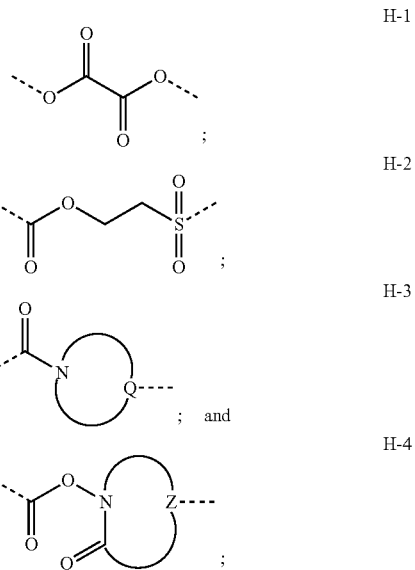

Q represents necessary atoms to form a five membered aromatic ring group;
Z represents necessary atoms to form a five or six membered ring group; and
the dashed lines represent bonds to remaining portions of the hydrolyzable polyfunctional monomer or oligomer.

10. The UV curable inkjet ink according to claim 9, wherein the one or more water absorption controlling monomers include at least one functional group selected from the group consisting of an ethylene oxide or oligo-ethylene oxide group, a hydroxyl group, and a morpholino group.

11. The UV curable inkjet ink according to claim 9, wherein the at least one alkali hydrolyzable group is an oxalate group.

12. The UV curable inkjet ink according to claim 9, wherein the one or more hydrolyzable polyfunctional monomer or oligomer is a difunctional hydrolyzable polyfunctional monomer or oligomer.

* * * * *